United States Patent
Kong et al.

(10) Patent No.: US 10,706,901 B2
(45) Date of Patent: Jul. 7, 2020

(54) INTEGRATED CIRCUIT HAVING AN ELECTROSTATIC DISCHARGE PROTECTION FUNCTION AND AN ELECTRONIC SYSTEM INCLUDING THE SAME

(71) Applicant: SAMSUNG ELECTRONICS CO., LTD., Suwon-si, Gyeonggi-do (KR)

(72) Inventors: Ki Ho Kong, Suwon-si (KR); Chang Hee Shin, Gimpo-si (KR); Hong Keun Yune, Seoul (KR); Jae Hyok Ko, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 869 days.

(21) Appl. No.: 15/293,422

(22) Filed: Oct. 14, 2016

(65) Prior Publication Data
US 2017/0110170 A1 Apr. 20, 2017

(30) Foreign Application Priority Data
Oct. 15, 2015 (KR) .................... 10-2015-0143946

(51) Int. Cl.
*G11C 7/24* (2006.01)
*G11C 17/08* (2006.01)
(Continued)

(52) U.S. Cl.
CPC ............... *G11C 7/24* (2013.01); *G11C 17/08* (2013.01); *H01L 23/528* (2013.01);
(Continued)

(58) Field of Classification Search
CPC .... G05F 1/571; G11C 17/08; G11C 7/24; H01L 23/528; H01L 23/5286;
(Continued)

(56) References Cited

U.S. PATENT DOCUMENTS 5,726,505 A * 3/1998 Yamada .................. H02H 3/18
307/116
5,959,488 A 9/1999 Lin et al.
(Continued)

FOREIGN PATENT DOCUMENTS

JP        4467629      5/2010
JP       2013-183107      9/2013
(Continued)

OTHER PUBLICATIONS

IEEE Xplore Digital Library [online]. ieeexplore.ieee.org [retrieved on May 10, 2010]. Retrieved from the Internet: URL: https://ieeexplore.ieee.org/stamp/stamp.jsp?tp=&arnumber=5470226&tag=1. (Year: 2010).*

*Primary Examiner* — Kevin J Comber
*Assistant Examiner* — Nicolas Bellido
(74) *Attorney, Agent, or Firm* — F. Chau & Associates, LLC (57) ABSTRACT

An integrated circuit includes a data processing circuit, an electrostatic discharge (ESD) protection circuit which is connected between a voltage rail and a ground rail and protects the data processing circuit from an ESD event on the voltage rail, and a switch circuit for controlling a connection between the voltage rail and the data processing circuit in response to a control signal.

19 Claims, 8 Drawing Sheets

(51) Int. Cl.
  *H01L 23/528* (2006.01)
  *H01L 27/02* (2006.01)
  *H01L 27/112* (2006.01)
  *H01H 9/04* (2006.01)
  *H02H 9/04* (2006.01)

(52) U.S. Cl.
  CPC ...... *H01L 27/0255* (2013.01); *H01L 27/0266* (2013.01); *H01L 27/0288* (2013.01); *H01L 27/0292* (2013.01); *H01L 27/11286* (2013.01); *H02H 9/046* (2013.01); *H01L 23/5286* (2013.01)

(58) Field of Classification Search
  CPC . H01L 23/60; H01L 27/0248; H01L 27/0255; H01L 27/0266; H01L 27/0288; H01L 27/0292; H01L 27/11286; H02H 3/14; H02H 3/20; H02H 3/202; H02H 3/207; H02H 3/22; H02H 3/24; H02H 3/325; H02H 3/332; H02H 3/36; H02H 7/09; H02H 7/1252; H02H 9/046; H05K 1/0259
  See application file for complete search history.

(56) References Cited

U.S. PATENT DOCUMENTS

| | | | |
|---|---|---|---|
| 7,282,767 | B2 | 10/2007 | Duvvury et al. |
| 7,355,476 | B2 | 4/2008 | Kasha et al. |
| 7,804,669 | B2 | 9/2010 | Worley |
| 8,648,420 | B2 | 2/2014 | Kim et al. |
| 8,929,039 | B2 | 1/2015 | Bajaj et al. |
| 8,929,042 | B2 | 1/2015 | Pfitzer et al. |
| 8,963,201 | B2 | 2/2015 | Shrivastava et al. |
| 9,236,375 | B2 * | 1/2016 | Sun ............ H01L 27/0285 |
| 2009/0059451 | A1 | 3/2009 | Shi et al. |
| 2010/0254051 | A1 | 10/2010 | Jeon et al. |
| 2013/0182359 | A1 * | 7/2013 | Jeon ............... H02H 9/046 361/56 |
| 2014/0247526 | A1 * | 9/2014 | Lai ............... H02H 9/046 361/56 |

FOREIGN PATENT DOCUMENTS

| | | |
|---|---|---|
| KR | 10-1128897 | 3/2012 |
| KR | 10-1197509 | 10/2012 |
| KR | 10-1239102 | 2/2013 |
| KR | 10-2014-0056993 | 5/2014 |

\* cited by examiner

INTEGRATED CIRCUIT HAVING AN ELECTROSTATIC DISCHARGE PROTECTION FUNCTION AND AN ELECTRONIC SYSTEM INCLUDING THE SAME

CROSS-REFERENCE TO RELATED APPLICATION

This application claims priority under 35 U.S.C. § 119(a) to Korean Patent Application No. 10-2015-0143946 filed on Oct. 15, 2015, the disclosure of which is incorporated by reference herein in its entirety.

TECHNICAL FIELD

Exemplary embodiments of the present inventive concept relate to an integrated circuit having an electrostatic discharge (ESD) protection function and an electronic system having the same.

DISCUSSION OF RELATED ART

Static electricity is caused by electrostatic charges generated when two objects of different potentials directly contact each other, for example. Electrostatic discharge (ESD) occurs when the electrostatic charges are exchanged.

When ESD flows into a semiconductor chip manufactured by a micro process, a circuit element embodied in the semiconductor chip may be damaged. Various ESD protection circuits are embodied in a semiconductor chip to prevent ESD. In general, an ESD protection circuit includes a power clamp to discharge an ESD current flowing into an input/output pad to ground.

To increase ESD immunity, various techniques have been employed. For example, an area of the power clamp has been increased in one method, a routing resistance from an input/output pad to the power clamp has been decreased in another method, and the routing resistance between the power clamp and an internal circuit has been increased in yet another method.

However, when the area of the power clamp is increased, an area of a semiconductor chip including the power clamp is also increased. In addition, when the routing resistance from the input/output pad to the power clamp is decreased, a layout position of the power clamp is limited due to an increase in a routing area for the routing resistance. Further, when an internal circuit inputs or outputs data in an analog method, an increase in the routing resistance between the power clamp and the internal circuit is limited.

SUMMARY

An exemplary embodiment of the present inventive concept is directed to an integrated circuit, including a data processing circuit, an electrostatic discharge (ESD) protection circuit which is connected between a voltage rail and a ground rail and protects the data processing circuit from an ESD event on the voltage rail, and a switch circuit which controls a connection between the voltage rail and the data processing circuit in response to a control signal.

The integrated circuit may further include a controller which determines whether the data processing circuit performs a data processing operation, and generates the control signal for controlling a connection between the voltage rail and the data processing circuit according to a result of the determination.

The controller may generate the control signal for connecting the voltage rail and the data processing circuit when the data processing circuit performs the data processing operation, and generate the control signal for blocking the connection between the voltage rail and the data processing circuit when the data processing circuit does not perform the data processing operation. The data processing operation may be a write operation or a read operation.

The switch circuit may include a first switch which is connected between the voltage rail and the data processing circuit and includes a first control terminal, and a second switch which is connected between the first control terminal and the ground rail, includes a second control terminal, and controls a connection between the first control terminal and the ground rail in response to the control signal input to the second control terminal.

The switch circuit may further include a discharge circuit which is disposed between the second control terminal and the voltage rail. The discharge circuit may discharge a current flowing from the first control terminal into the second control terminal to the ground rail when the ESD event occurs.

The discharge circuit may be a resistor, a capacitor, a metal oxide semiconductor (MOS) capacitor, or a diode-connected transistor. The switch circuit may further include a resistor connected between the voltage rail and the first control terminal. The first switch may be a p-channel MOS (PMOS) transistor and a second switch may be an n-channel MOS (NMOS) transistor. The data processing circuit may be a one time programmable (OTP) memory.

An exemplary embodiment of the present inventive concept is directed to an electronic system, including a data processing circuit, a first controller for controlling the data processing circuit, an ESD protection circuit which is connected between a voltage rail and a ground rail and protects the data processing circuit from an electrostatic discharge (ESD) event on the voltage rail, and a switch circuit for controlling a connection between the voltage rail and the data processing circuit in response to a control signal.

The electronic system further includes a second controller which determines whether the data processing circuit performs a data processing operation, and generates the control signal for controlling a connection between the voltage rail and the data processing circuit according to a result of the determination.

The second controller generates the control signal for connecting the voltage rail and the data processing circuit when the data processing circuit performs the data processing operation, and generates the control signal for blocking the connection between the voltage rail and the data processing circuit when the data processing circuit does not perform the data processing operation.

The switch circuit includes a first switch which is connected between the voltage rail and the data processing circuit and includes a first control terminal, a second switch which is connected between the first control terminal and the ground rail, includes a second control terminal, and controls a connection between the first control terminal and the ground rail in response to the control signal input to the second control terminal, and a discharge circuit which is disposed between the second control terminal and the ground rail.

An exemplary embodiment of the present inventive concept is directed to an integrated circuit comprising: a data processing circuit; an ESD circuit configured to protect the data processing circuit from ESD; and a switch circuit configured to block the ESD from flowing into the data processing circuit while the ESD is discharged by the ESD circuit.

The switch circuit is adjusted to operate as a resistor with a high resistance value to block the ESD while the ESD is discharged from the ESD circuit.

The switch circuit is adjusted to operate as a resistor with a low resistance value to deliver a voltage to the data processing circuit.

The switch circuit includes an ESD discharge path.

The ESD discharge path includes a resistor, a capacitor, a MOS capacitor, or a diode-connected transistor.

BRIEF DESCRIPTION OF THE DRAWINGS

The above and other features of the present inventive concept will become apparent by describing in detail exemplary embodiments thereof with reference to the accompanying drawings in which.

DETAILED DESCRIPTION OF THE EMBODIMENTS

The present inventive concept now will be described more fully with reference to the accompanying drawings. The inventive concept may, however, be embodied in many different forms and should not be construed as being limited to only the illustrated embodiments. Throughout the written description and drawings, like reference numbers and labels may denote like or similar elements. All elements throughout the specification and drawings may be circuits.

It will be understood that when an element is referred to as being "connected" or "coupled" to another element, it can be directly connected or coupled to the other element or intervening elements may be present.

Figure 1:
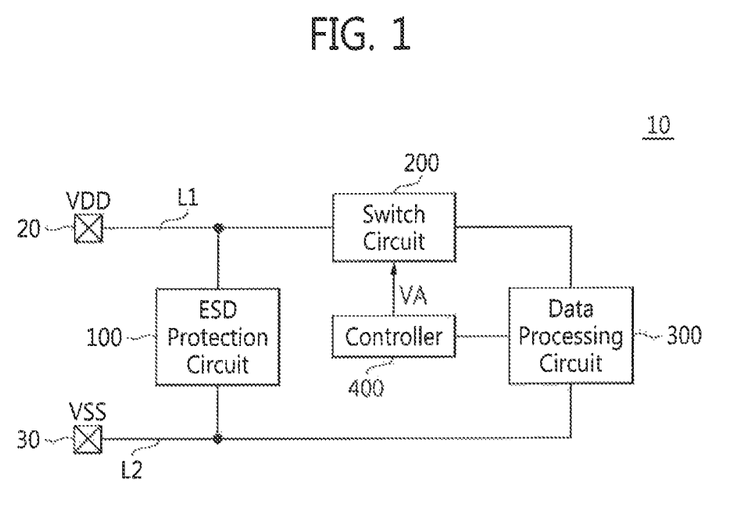
FIG. 1 is a block diagram which shows a configuration of an integrated circuit according to an exemplary embodiment of the present inventive concept.

As used herein, the singular forms "a", "an" and "the" are intended to include the plural forms as well, unless the context clearly indicates otherwise. FIG. 1 is a block diagram which shows a configuration of an integrated circuit according to an exemplary embodiment of the present inventive concept. Referring to FIG. 1, an integrated circuit 10 may include an ESD protection circuit 100, a switch circuit 200, a data processing circuit 300, and a controller 400. The integrated circuit 10 may refer to a central processing unit (CPU), a processor, or a system on chip.

The ESD protection circuit 100 may be connected between a voltage rail L1 for transmitting a first voltage VDD and a ground rail L2 for transmitting a ground voltage VSS, and may protect the data processing circuit 300 from an ESD event on a first pad 20 or a second pad 30. The first pad 20 may receive the first voltage VDD and the second pad 30 may receive the ground voltage VSS. Here, a rail may refer to a trace, a strap, a wire, or a conductive material for transmitting a voltage VDD or VSS. For example, the conductive material may be embodied in a metal, Cu, Ag, Au, Al, or W; however, it is not limited thereto.

The ESD protection circuit 100 may discharge an ESD input to the first pad 20 or the voltage rail L1 to the ground rail L2, thereby performing a function of preventing the ESD from flowing into another circuit (for example, the data processing circuit 300) in the integrated circuit 10.

The switch circuit 200 may control a connection between the voltage rail L1 and the data processing circuit 300 based on a control signal VA. The switch circuit 200 may be turned on or turned off according to the control signal VA. In other words, the switch circuit 200 may be turned on or off in response to the control signal VA. The resistance value of the switch circuit 200 may be adjusted according to the control signal VA, thereby the switch circuit 200 functions as a resistance control circuit.

For example, when the switch circuit 200 is turned off according to the control signal VA, the switch circuit 200 may operate as a resistor having a high resistance value (for example, several $M\Omega$ to hundreds of $M\Omega$). In this case, while an ESD generated by an ESD event is discharged through the ESD protection circuit 100, the switch circuit 200 functions as a barrier which prevents the ESD from flowing into the data processing circuit 300, thereby protecting the data processing circuit 300 from the ESD event along with the ESD protection circuit 100.

When the switch circuit 200 is turned on according to the control signal VA, the switch circuit 200 may operate as a resistor having a low resistance value (for example, several $\Omega$ to tens of $\Omega$). In this case, the switch circuit 200 delivers the voltage VDD supplied from the first pad 20 to the data processing circuit 300. The integrated circuit 10 including the switch circuit 200 may be used in an analog input/output method.

When an ESD delivered to the data processing circuit 300 is intercepted, the resistance value of the switch circuit 200 is adjusted to be a large value, and thereby the ESD delivered to the data processing circuit 300 can be effectively suppressed even though the size of the ESD protection circuit 100 is small. For example, the ESD protection circuit 100 is smaller than a conventional ESD protection circuit. Accordingly, the layout position of the ESD protection circuit 100 may be more freely determined.

The data processing circuit 300 may refer to a functional block which can write or read data. For example, the data processing circuit 300, as a functional block used in a system on chip (SoC), may refer to a CPU, a processor, each core of a multi-core processor, a universal serial bus (USB), a peripheral component interconnect (PCI), a digital signal processor (DSP), a wired interface, a wireless interface, a controller, a codec, a video module (for example, a camera interface, a joint photographic experts group (JPEG) processor, a video processor, or a mixer), a three-dimensional (3D) graphic core, an audio system, or a driver.

The controller 400 may control a data processing operation of the data processing circuit 300. The controller 400 may determine whether the data processing operation is performed, and generate a control signal VA for controlling a switch operation of the switch circuit 200 according to a result of the determination.

For example, when the data processing circuit 300 performs the data processing operation, the controller 400 may generate a control signal VA for connecting the voltage rail L1 and the data processing circuit 300.

In addition, when the data processing circuit 300 does not perform the data processing operation, the controller 400 may generate a control signal VA for separating the data processing circuit 300 from the voltage rail L1. The data processing operation may be a write operation or a read operation. For example, the data processing circuit 300 and the controller 400 may configure an internal core circuit.

Although the controller 400 is illustrated as a separate device from the data processing device 300 in FIG. 1, the controller 400 may be included in at least a portion of the data processing device 300.

Figure 2:
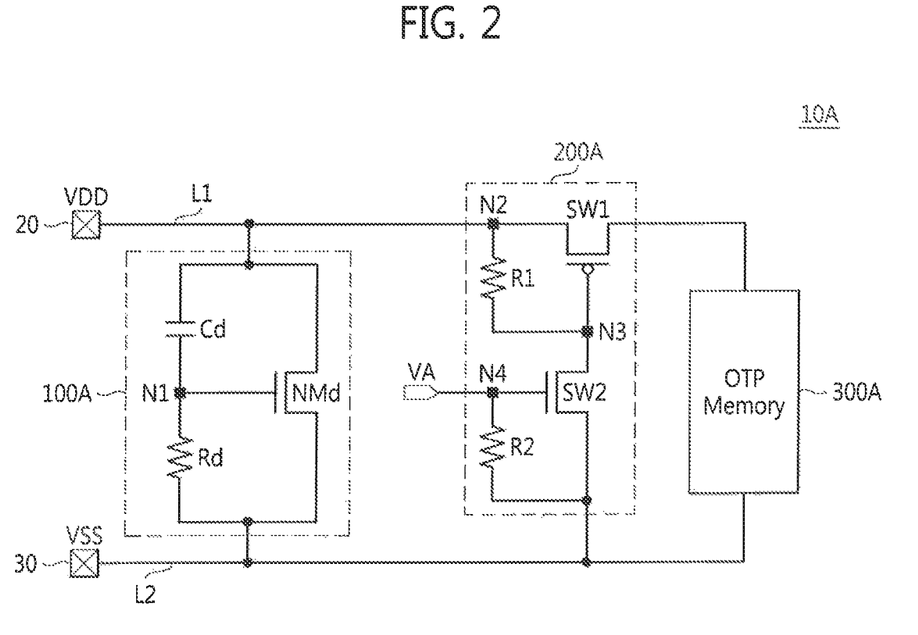
FIG. 2 is a circuit diagram which shows a configuration of an integrated circuit according to an exemplary embodiment of the present inventive concept.
Figure 3:
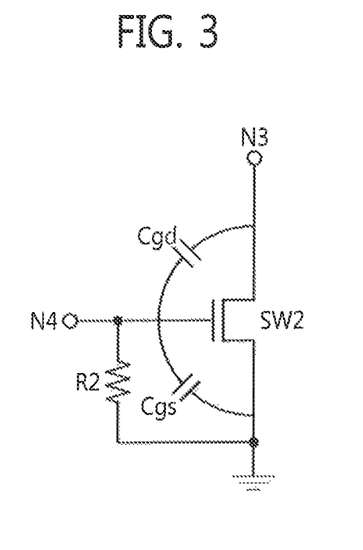
FIG. 3 is a diagram for describing a parasitic capacitor in a second switch of FIG. 2.

FIG. 2 is a circuit diagram which shows a configuration of an integrated circuit according to an exemplary embodiment of the present inventive concept, and FIG. 3 is a diagram for describing a parasitic capacitor in a second switch of FIG. 2. Referring to FIGS. 1 and 2, an integrated circuit 10A may include an ESD protection circuit 100A, a switch circuit 200A, and a one-time programmable (OTP) read only memory 300A.

When an ESD event (e.g., ESD) occurs, the ESD protection circuit 100A may discharge an ESD flowing into the integrated circuit 10A from the first pad 20 to the second pad 30. According to an exemplary embodiment of the present inventive concept, the ESD protection circuit 100A may refer to a power clamp and may include a capacitor Cd, a resistor Rd, and a transistor NMd.

The capacitor Cd may be connected between the voltage rail L1 and a first node N1. The resistor Rd may be connected between the first node N1 and the ground rail L2. The transistor NMd may be connected between the voltage rail L1 and the ground rail L2, and the gate of the transistor NMd may be connected to the first node N1.

When the ESD event occurs, an ESD is supplied to the capacitor Cd through the voltage rail L1, and accordingly, a voltage of the first node N1 is increased. As a result, the transistor NMd is turned on, and thereby the ESD of the voltage rail L1 is instantaneously discharged to the ground rail L2 through the transistor NMd.

The switch circuit 200A may include a first switch SW1, a second switch SW2, a first resistor R1, and a second resistor R2. The first switch SW1 may be connected between the voltage rail L1 and the OTP memory 300A. The first switch SW1 may be referred to as a first transistor, e.g., a p-channel metal oxide semiconductor (PMOS) transistor. The first switch SW1 may be turned on or turned off according to a first control voltage (for example, the voltage of a third node N3) input to the control terminal of the first switch SW1. When the first switch SW1 is turned on, the first switch SW1 may connect the voltage rail L1 and the OTP memory 300A. When the first switch SW1 is turned off, the first switch SW1 may separate the OTP memory 300A from the voltage rail L1.

The second switch SW2 may be connected between the third node N3 and the ground rail L2. The second switch SW2 may be referred to as a second transistor, e.g., an n-channel MOS (NMOS) transistor. The second switch SW2 may be turned on or turned off according to a second control voltage VA input to the control terminal of the second switch SW2.

The controller 400 may supply the second control voltage VA to the control terminal of the second switch SW2 according to whether the OTP memory 300A performs a data processing operation. The control signal VA of FIG. 1 may refer to the second control voltage VA.

When the OTP memory 300A performs the data processing operation, the controller 400 may set the second control voltage VA to a high level. Moreover, when the OTP memory 300A does not perform the data processing operation, the controller 400 may set the second control voltage VA to a low level. The second switch SW2 is turned on in response to the second control voltage VA having a high level, and the second switch SW2 is turned off in response to the second control voltage VA having a low level.

In the following description, the operation of the switch circuit 200A when the OTP memory 300A performs the data processing operation and the operation of the switch circuit 200A when the OTP memory 300A does not perform the data processing operation will be described.

When the OTP memory 300A performs a data processing operation (for example, a write operation), the controller 400 generates the second control voltage VA having a high level, such that the second switch SW2 is turned on. Accordingly, the first control voltage of the third node N3 is at a low level. The first switch SW1 is turned on, and thereby the first voltage VDD is supplied to the OTP memory 300A through the switch circuit 200A. The OTP memory 300A may perform the data processing operation (for example, a write operation) using the first voltage VDD.

When the OTP memory 300A does not perform the data processing operation (for example, a write operation), the controller 400 generates a control voltage VA having a low level, such that the second switch SW2 is turned off. Since the first voltage VDD is supplied to the first control terminal of the first switch SW1 through the first resistor R1, the first switch SW1 is kept off. The OTP memory 300A does not perform the data processing operation when there is an ESD condition. In other words, when there is the ESD condition, the first switch SW1 is maintained in the off state, such that the first voltage VDD is not supplied to the OTP memory 300A through the switch circuit 200A.

According to an exemplary embodiment of the present inventive concept, when the OTP memory 300A does not perform the data processing operation, in other words, when there is the ESD condition, the second control voltage VA may be in a floating state which is neither a high level nor a low level.

The first resistor R1 may prevent the first switch SW1 from being turned on in an abnormal condition.

In the following description, when the OTP memory 300A does not perform the data processing operation, the operation of an integrated circuit 10A is described under the assumption that an ESD event occurs.

When the OTP memory 300A does not perform the data processing operation, the second control voltage VA is either at a low level or in a floating state, and both of the first switch SW1 and the second switch SW2 may be turned off.

Referring to FIG. 3, a first parasitic capacitor Cgd is formed between the gate and the drain of the second switch SW2, e.g., a second transistor, and a second parasitic capacitor Cgs is formed between the gate and the source of the second transistor.

When an ESD occurs in the first pad 20, a signal generated by the ESD may be supplied or induced to the gate of the second transistor through the first parasitic capacitor Cgd. The second resistor R2 functions as a discharge circuit, and a signal supplied or induced to the gate of the second transistor through the first parasitic capacitor Cgd is discharged through the second resistor R2. In other words, the second resistor R2 may prevent the second switch SW2 from being unintentionally turned on when there is ESD. The OTP memory 300A may be used to store data for controlling the operation of a semiconductor device or the SoC.

Figure 4:
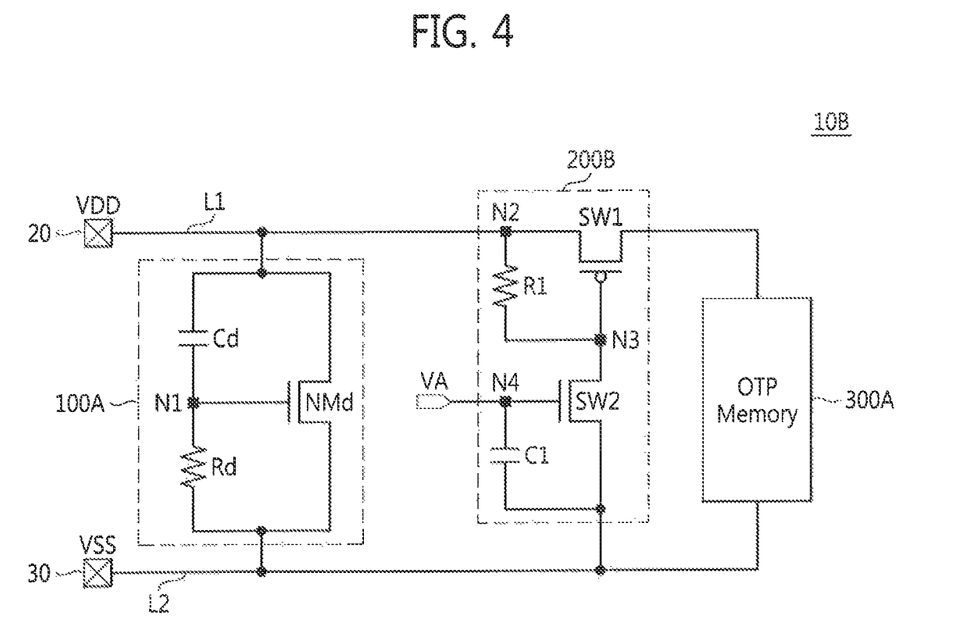
FIG. 4 is a circuit diagram which shows a configuration of an integrated circuit according to an exemplary embodiment of the present inventive concept.

FIG. 4 is a circuit diagram which shows a configuration of an integrated circuit according to an exemplary embodiment of the present inventive concept. Referring to FIGS. 2 and 4, except that the second resistor R2 is swapped with a capacitor C1, an integrated circuit 10B of FIG. 4 is the same as or similar to the integrated circuit 10A of FIG. 2 in structure and operation. The integrated circuit 10B of FIG. 4 may include a switch circuit 200B including the capacitor C1.

The capacitor C1 may function the same as or similar to that of the second resistor R2. In other words, the capacitor C1 functions as a discharge circuit, and the signal supplied or induced to the gate of the second transistor SW2 through the first parasitic capacitor Cgd is discharged through the capacitor C1. In other words, the capacitor C1 may prevent the second switch SW2 from being unintentionally turned on when there is ESD.

Figure 5:
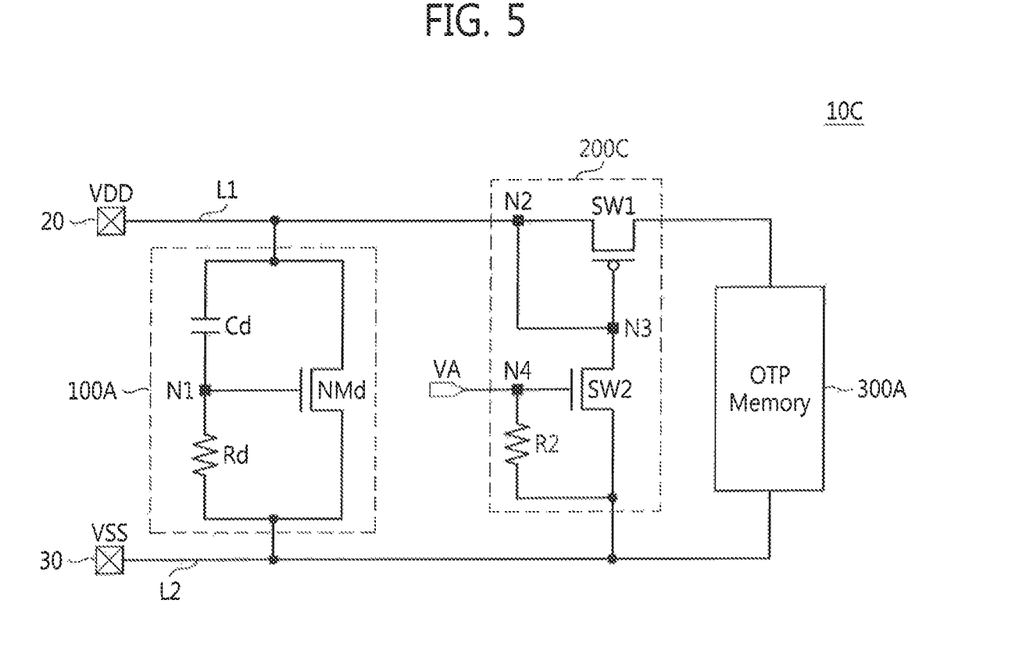
FIG. 5 is a circuit diagram which shows a configuration of an integrated circuit according to an exemplary embodiment of the present inventive concept.

FIG. 5 is a circuit diagram which shows a configuration of an integrated circuit according to an exemplary embodiment of the present inventive concept. Referring to FIGS. 2 and 5, except that the first resistor R1 is swapped with a transmission line, an integrated circuit 10C of FIG. 5 is the same as or similar to the integrated circuit 10A of FIG. 2 in structure and operation. The integrated circuit 10C of FIG. 5 may include a switch circuit 200C including a transmission line.

Figure 6:
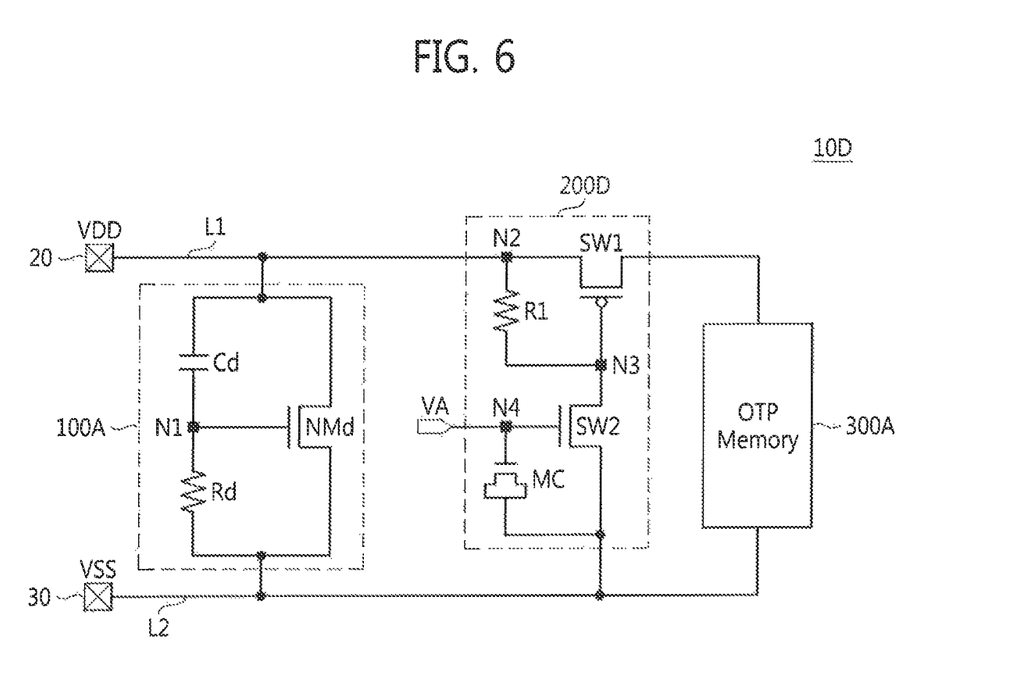
FIG. 6 is a circuit diagram which shows a configuration of an integrated circuit according to an exemplary embodiment of the present inventive concept.

FIG. 6 is a circuit diagram which shows a configuration of an integrated circuit according to an exemplary embodiment of the present inventive concept. Referring to FIGS. 2 and 6, except that the second resistor R2 is swapped with a MOS capacitor MC, an integrated circuit 10D of FIG. 6 is the same as or similar to the integrated circuit 10A of FIG. 2 in structure and operation. The integrated circuit 10D of FIG. 6 may include a switch circuit 200D including the MOS capacitor MC.

The MOS capacitor MC may function the same as or similar to that of the second resistor R2. In other words, the MOS capacitor MC functions as a discharge circuit, and the signal supplied or induced to the gate of the second transistor SW2 through the first parasitic capacitor Cgd is discharged through the MOS capacitor MC. In other words, the MOS capacitor MC may prevent the second switch SW2 from being unintentionally turned on when there is ESD.

Figure 7:
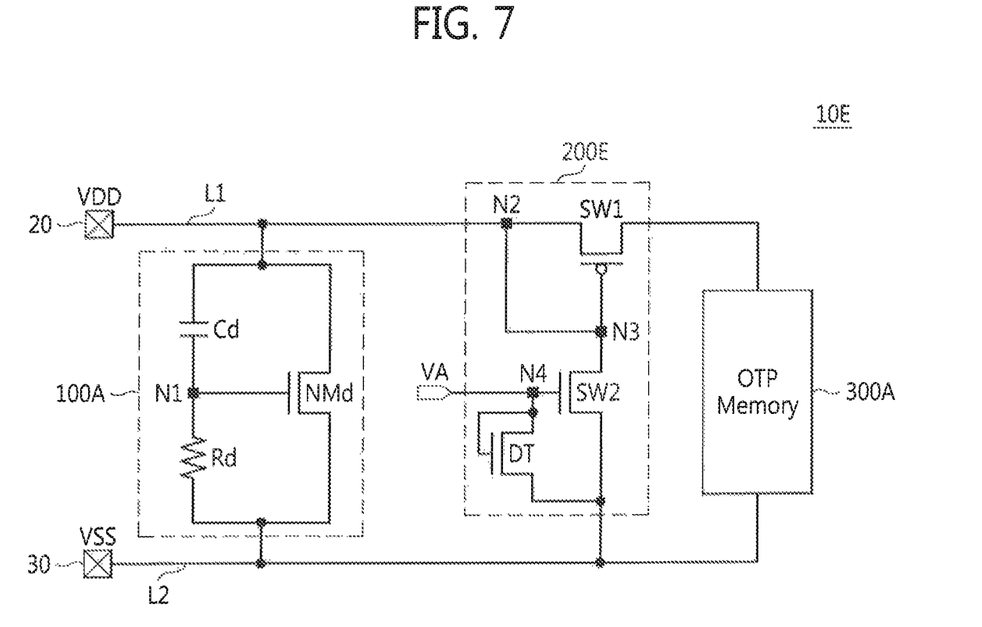
FIG. 7 is a circuit diagram which shows a configuration of an integrated circuit according to an exemplary embodiment of the present inventive concept.

FIG. 7 is a circuit diagram which shows a configuration of an integrated circuit according to an exemplary embodiment of the present inventive concept. Referring to FIGS. 2 and 7, except that the second resistor R2 is swapped with a diode-connected transistor DT, an integrated circuit 10E of FIG. 7 is the same as or similar to the integrated circuit 10A of FIG. 2 in structure and operation. The integrated circuit 10E of FIG. 7 may include a switch circuit 200E including the diode-connected transistor DT.

The diode-connected transistor DT may function the same as or similar to that of the second resistor R2. In other words, the diode-connected transistor DT functions as a discharge circuit, and the signal supplied or induced to the gate of the second transistor SW2 through the first parasitic capacitor Cgd is discharged through the diode-connected transistor DT. In other words, the diode-connected transistor DT may prevent the second switch SW2 from being unintentionally turned on when there is ESD.

Figure 8:
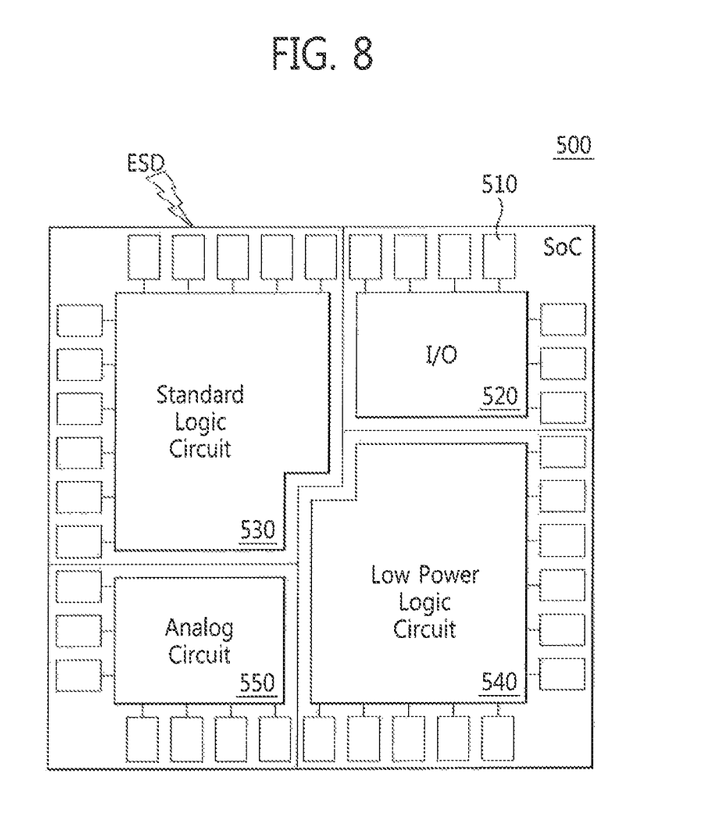
FIG. 8 is a block diagram which shows a configuration of an electronic system including the integrated circuit of FIG. 1 according to an exemplary embodiment of the present inventive concept.

FIG. 8 is a block diagram which shows a configuration of an electronic system including the integrated circuit of FIG. 1 according to an exemplary embodiment of the present inventive concept. Referring to FIGS. 1 to 8, an electronic system 500 may include a plurality of protection circuits 510, an input/output circuit 520, a standard logic circuit 530, a low power logic circuit 540, and an analog circuit 550. The electronic system 500 may refer to a CPU, a processor, a SoC, or an application processor. The OTP memory may be embodied in one of the circuits 520, 530, 540, and 550.

Each of the plurality of protection circuits 510 may include an ESD protection circuit 100A, a switch circuit 200A, 200B, 200C, 200D, or 200E (collectively, 200), and a controller 400 described referring to FIGS. 1 to 7. A corresponding ESD protection circuit 100A from among the plurality of protection circuits 510 may protect a circuit, which is included in the circuits 520, 530, 540, and 550, from ESD. The input/output circuit 520 may include circuits related to the input/output of data, e.g., an input buffer and an output driver.

The standard logic circuit 530 may refer to a circuit including Boolean gates. The Boolean gates may include standard cells such as a NAND gate, an AND gate, an OR gate, a NOR gate, an XOR gate, an XNOR gate and an inverter (e.g., a NOT gate). The standard block circuit 530 may refer to a CPU core.

The low power logic circuit 540 may include logic circuits consuming less power. An analog circuit 550 may include circuits for processing analog signals.

An integrated circuit according to an exemplary embodiment of the present inventive concept has an ESD protection function which can independently adjust a resistance value between an ESD protection circuit and an internal circuit using a switch system. For example, the integrated circuit according to an exemplary embodiment of the present inventive concept can adjust a resistance value between an ESD protection circuit and an internal circuit to be low (e.g., very low) during the input/output of data. The integrated circuit according to an exemplary embodiment of the present inventive concept has a large (e.g., very large) resistance between the ESD protection circuit and the internal circuit when an ESD event occurs, thereby decreasing a power clamp in size and enabling the position of the power clamp to be more freely determined in the integrated circuit.

While the present inventive concept has been shown and described with reference to exemplary embodiments thereof, it will be appreciated by those skilled in the art that changes may be made in these embodiments without departing from the scope and spirit of the present inventive concept as defined in the appended claims.

What is claimed is:
1. An integrated circuit, comprising:
a data processing circuit;
an electrostatic discharge (ESD) protection circuit which is connected between a voltage rail and a ground rail, and protects the data processing circuit from an ESD event on the voltage rail; and
a switch circuit for controlling a connection between the voltage rail and the data processing circuit in response to a control signal,
wherein the switch circuit includes:
a first switch which is connected between the voltage rail and the data processing circuit and includes a first control terminal; and
a second switch which is connected between the first control terminal and the ground rail, includes a second control terminal and controls a connection between the first control terminal and the ground rail in response to the control signal input to the second control terminal.

2. The integrated circuit of claim 1, further comprising a controller which determines whether the data processing circuit performs a data processing operation, and generates the control signal for controlling the connection between the voltage rail and the data processing circuit according to a result of the determination.

3. The integrated circuit of claim 2, wherein the controller generates the control signal for connecting the voltage rail and the data processing circuit when the data processing circuit performs the data processing operation, and generates the control signal for blocking the connection between the voltage rail and the data processing circuit when the data processing circuit does not perform the data processing operation.

4. The integrated circuit of claim 3, wherein the data processing operation is a write operation or a read operation.

5. The integrated circuit of claim 1, wherein the switch circuit further includes a discharge circuit which is disposed between the second control terminal and the ground rail.

6. The integrated circuit of claim 5, wherein the discharge circuit discharges a current flowing from the first control terminal into the second control terminal to the ground rail when the ESD event occurs.

7. The integrated circuit of claim 5, wherein the discharge circuit is a resistor, a capacitor, a metal-oxide semiconductor (MOS) capacitor, or a diode-connected transistor.

8. The integrated circuit of claim 1, wherein the switch circuit further includes a resistor connected between the voltage rail and the first control terminal.

9. The integrated circuit of claim 1, wherein the first switch is a p-channel metal oxide semiconductor (PMOS) transistor and the second switch is an n-channel MOS (NMOS) transistor.

10. The integrated circuit of claim 1, wherein the data processing circuit is a one time programmable (OTP) memory.

11. An electronic system, comprising:
a data processing circuit;
an electrostatic discharge (ESD) protection circuit which is connected between a voltage rail and a ground rail and protects the data processing circuit from an ESD event on the voltage rail; and
a switch circuit for controlling a connection between the voltage rail and the data processing circuit in response to a control signal,
wherein the switch circuit includes:
a first switch which is connected between the voltage rail and the data processing circuit and includes a first control terminal; and
a second switch which is connected between the first control terminal and the ground rail, includes a second control terminal, and controls a connection between the first control terminal and the ground rail in response to the control signal input to the second control terminal.

12. The electronic system of claim 11, further comprising a controller which determines whether the data processing circuit performs a data processing operation, and generates the control signal for controlling the connection between the voltage rail and the data processing circuit according to a result of the determination.

13. The electronic system of claim 12, wherein the controller generates the control signal for connecting the voltage rail and the data processing circuit when the data processing circuit performs the data processing operation, and generates the control signal for blocking the connection between the voltage rail and the data processing circuit when the data processing circuit does not perform the data processing operation.

14. The electronic system of claim 11, wherein the switch circuit further includes:
a discharge circuit which is disposed between the second control terminal and the ground rail.

15. An integrated circuit, comprising:
a data processing circuit;
an electrostatic discharge (ESD) circuit configured to protect the data processing circuit from an ESD event; and
a switch circuit configured to block a connection between the ESD circuit and the data processing circuit while the ESD event occurs,
wherein the switch circuit includes:
a first switch connected between a voltage rail and the data processing circuit; and
a second switch connected between a first control terminal of the first switch and the ground rail, and controls a connection between the first control terminal and the ground rail in response to a control signal input to a second control terminal of the second switch.

16. The integrated circuit of claim 15, wherein the switch circuit is adjusted to operate as a resistor with a high resistance value to block the ESD event.

17. The integrated circuit of claim 15, wherein the switch circuit is adjusted to operate as a resistor with a low resistance value to deliver a voltage to the data processing circuit.

18. The integrated circuit of claim 15, wherein the first switch is a p-channel metal oxide semiconductor (PMOS) transistor and the second switch is an n-channel metal oxide semiconductor (NMOS) transistor.

19. The integrated circuit of claim 15, wherein the switch circuit further includes a resistor, a capacitor, a metal-oxide semiconductor (MOS) capacitor, or a diode-connected transistor.

* * * * *